United States Patent
Prasad et al.

(10) Patent No.: US 11,610,799 B2
(45) Date of Patent: Mar. 21, 2023

(54) ELECTROSTATIC CHUCK HAVING A HEATING AND CHUCKING CAPABILITIES

(71) Applicant: Applied Materials, Inc., Santa Clara, CA (US)

(72) Inventors: Bhaskar Prasad, Jamshedpur (IN); Kirankumar Neelasandra Savandaiah, Bangalore (IN); Srinivasa Rao Yedla, Bangalore (IN); Nitin Bharadwaj Satyavolu, Kakinada (IN); Hari Prasath Rajendran, Coimbatore (IN); Lakshmikanth Krishnamurthy Shirahatti, Bangalore (IN); Thomas Brezoczky, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 257 days.

(21) Appl. No.: 17/024,802

(22) Filed: Sep. 18, 2020

(65) Prior Publication Data

US 2022/0093439 A1 Mar. 24, 2022

(51) Int. Cl.
 *H01T 23/00* (2006.01)
 *H01L 21/683* (2006.01)
 *H01L 21/67* (2006.01)

(52) U.S. Cl.
 CPC .... *H01L 21/6833* (2013.01); *H01L 21/67103* (2013.01); *H01L 21/67167* (2013.01)

(58) Field of Classification Search
 None
 See application file for complete search history.

(56) References Cited

U.S. PATENT DOCUMENTS

| | | | |
|---|---|---|---|
| 5,863,170 | A | 1/1999 | Boitnott et al. |
| 5,879,459 | A | 3/1999 | Gadgil et al. |
| 6,162,299 | A | 12/2000 | Raaijmakers |
| 6,440,261 | B1 | 8/2002 | Tepman et al. |
| 6,447,607 | B2 | 9/2002 | Soininen et al. |

(Continued)

FOREIGN PATENT DOCUMENTS

| | | |
|---|---|---|
| CN | 100411095 C | 8/2008 |
| CN | 102965643 B | 2/2016 |

(Continued)

OTHER PUBLICATIONS

International Search Report and Written Opinion, International Application No. PCT/US2021/049349, consists of 12 pages.

(Continued)

*Primary Examiner* — Stephen W Jackson
(74) *Attorney, Agent, or Firm* — Patterson + Sheridan, LLP

(57) ABSTRACT

In one example, an electrostatic chuck comprises a chuck body having a top surface configured to support a substrate and a bottom surface opposite the top surface. The chuck body comprises one or more chucking electrodes, and one or more heating elements. The chuck body further comprises first terminals disposed on the bottom surface of the chuck body and coupled with the one or more heating elements, second terminals disposed on the bottom surface of the chuck body and coupled with the one or more chucking electrodes, and third terminals disposed on the bottom first surface of the chuck body and coupled with the one or more chucking electrodes.

20 Claims, 10 Drawing Sheets

(56) References Cited

U.S. PATENT DOCUMENTS

| | | | |
|---|---|---|---|
| 6,576,062 B2 | 6/2003 | Matsuse | |
| 6,604,853 B2 | 8/2003 | Chao et al. | |
| 6,635,115 B1 | 10/2003 | Fairbairn et al. | |
| 6,852,194 B2 | 2/2005 | Matsushita et al. | |
| 6,962,471 B2 | 11/2005 | Birkner et al. | |
| 7,066,703 B2 | 6/2006 | Johnson | |
| 7,090,741 B2 | 8/2006 | Narushima et al. | |
| D527,751 S | 9/2006 | Kondoh et al. | |
| 7,138,336 B2 | 11/2006 | Lee et al. | |
| 7,169,234 B2 | 1/2007 | Weeks et al. | |
| 7,189,432 B2 | 3/2007 | Chiang et al. | |
| 7,258,768 B2 | 8/2007 | Yamakazi | |
| 7,318,869 B2 | 1/2008 | Chiang et al. | |
| 7,422,406 B2 | 9/2008 | van der Meulen | |
| 7,458,763 B2 | 12/2008 | van der Meulen | |
| 7,537,662 B2 | 5/2009 | Soininen et al. | |
| 7,784,164 B2 | 8/2010 | White et al. | |
| 7,799,179 B2 | 9/2010 | Maass et al. | |
| 7,806,983 B2 | 10/2010 | Chiang et al. | |
| 7,833,352 B2 | 11/2010 | Bondestam et al. | |
| 7,905,991 B2 | 3/2011 | Esselbach et al. | |
| 7,959,403 B2 | 6/2011 | van der Meulen | |
| 7,988,399 B2 | 8/2011 | van der Meulen | |
| 8,029,226 B2 | 10/2011 | van der Meulen | |
| 8,033,772 B2 | 10/2011 | Kurita et al. | |
| 8,088,678 B2 | 1/2012 | Kitano et al. | |
| 8,197,177 B2 | 6/2012 | van der Meulen et al. | |
| 8,216,380 B2 | 7/2012 | White et al. | |
| 8,267,632 B2 | 9/2012 | van der Meulen et al. | |
| 8,292,563 B2 | 10/2012 | Haris | |
| 8,313,277 B2 | 11/2012 | van der Meulen et al. | |
| 8,354,656 B2 | 1/2013 | Beloussov et al. | |
| 8,403,613 B2 | 3/2013 | van der Meulen | |
| 8,434,989 B2 | 5/2013 | van der Meulen | |
| 8,439,623 B2 | 5/2013 | van der Meulen | |
| 8,500,388 B2 | 8/2013 | van der Meulen et al. | |
| 8,523,507 B2 | 9/2013 | van der Meulen | |
| 8,558,299 B2 | 10/2013 | Cao et al. | |
| 8,574,409 B2 | 11/2013 | Kadlec et al. | |
| 8,602,716 B2 | 12/2013 | van der Meulen et al. | |
| 8,672,605 B2 | 3/2014 | van der Meulen et al. | |
| 8,696,298 B2 | 4/2014 | van der Meulen et al. | |
| 8,728,239 B2 | 5/2014 | Bauer et al. | |
| 8,807,905 B2 | 8/2014 | van der Meulen | |
| 8,812,150 B2 | 8/2014 | van der Meulen et al. | |
| 8,870,513 B2 | 10/2014 | Voser et al. | |
| 8,870,514 B2 | 10/2014 | van der Meulen et al. | |
| 8,895,450 B2 | 11/2014 | Cao et al. | |
| 8,944,738 B2 | 2/2015 | van der Meulen | |
| 8,945,308 B2 | 2/2015 | Schaller | |
| 9,005,539 B2 | 4/2015 | Halpin et al. | |
| 9,085,825 B2 | 7/2015 | Kim | |
| 9,103,030 B2 | 8/2015 | Kato et al. | |
| 9,214,589 B2 | 12/2015 | Voser et al. | |
| 9,252,037 B2 | 2/2016 | Scholte Von Mast et al. | |
| 9,281,222 B2 | 3/2016 | Weaver et al. | |
| 9,336,997 B2 | 5/2016 | Bera | |
| 9,340,874 B2 | 5/2016 | Halpin et al. | |
| 9,347,131 B2 | 5/2016 | Maass et al. | |
| 9,355,824 B2 | 5/2016 | Kadlec et al. | |
| 9,378,994 B2 | 6/2016 | Weaver et al. | |
| 9,396,981 B2 | 7/2016 | Scholte Von Mast et al. | |
| 9,443,749 B2 | 9/2016 | Wakabayashi et al. | |
| 9,478,420 B2 | 10/2016 | Castaldi et al. | |
| 9,490,149 B2 | 11/2016 | Chandrasekharan et al. | |
| 9,551,068 B2 | 1/2017 | Kumagai et al. | |
| 9,583,349 B2 | 2/2017 | Gandikota et al. | |
| 9,587,306 B2 | 3/2017 | Rohrmann et al. | |
| 9,644,261 B2 | 5/2017 | Weichart et al. | |
| 9,698,009 B2 | 7/2017 | Sato et al. | |
| 9,831,094 B2 | 11/2017 | Rahtu et al. | |
| 9,842,755 B2 | 12/2017 | Ocker et al. | |
| 9,884,726 B2 | 2/2018 | van der Meulen et al. | |
| 9,890,473 B2 | 2/2018 | Newman | |
| 9,929,008 B2 | 3/2018 | Wamura et al. | |
| 9,932,674 B2 | 4/2018 | Kato et al. | |
| 9,953,843 B2 | 4/2018 | Shen et al. | |
| 9,960,072 B2 | 5/2018 | Coomer | |
| 10,043,693 B1 | 8/2018 | Kim et al. | |
| 10,086,511 B2 | 10/2018 | van der Meulen | |
| 10,138,553 B2 | 11/2018 | Scholte Von Mast et al. | |
| 10,145,014 B2 | 12/2018 | Nozawa et al. | |
| 10,202,682 B2 | 2/2019 | Rieschl et al. | |
| 10,202,687 B2 | 2/2019 | Miura et al. | |
| 10,221,480 B2 | 3/2019 | Kato et al. | |
| 10,256,125 B2 | 4/2019 | Weaver et al. | |
| 10,262,888 B2 | 4/2019 | Gangakhedkar et al. | |
| 10,347,515 B2 | 7/2019 | Heinz | |
| 10,388,559 B2 | 8/2019 | Rieschl et al. | |
| 10,427,303 B2 | 10/2019 | Weaver et al. | |
| 10,586,720 B2 | 3/2020 | Weaver et al. | |
| 2002/0051698 A1 | 5/2002 | Birkner et al. | |
| 2002/0170671 A1 | 11/2002 | Matsushita et al. | |
| 2003/0109094 A1 | 6/2003 | Seidel et al. | |
| 2004/0159553 A1 | 8/2004 | Nogami et al. | |
| 2004/0175549 A1* | 9/2004 | Ito | C04B 35/5611 428/209 |
| 2004/0261710 A1 | 12/2004 | Matsushita et al. | |
| 2005/0005850 A1 | 1/2005 | Yamakazi | |
| 2005/0006230 A1 | 1/2005 | Narushima et al. | |
| 2005/0111936 A1 | 5/2005 | Kim et al. | |
| 2005/0115822 A1 | 6/2005 | Maass et al. | |
| 2005/0118009 A1 | 6/2005 | van der Meulen | |
| 2005/0264791 A1 | 12/2005 | del Puerto et al. | |
| 2006/0051507 A1 | 3/2006 | Kurita et al. | |
| 2006/0056952 A1 | 3/2006 | Haris | |
| 2006/0101728 A1 | 5/2006 | White et al. | |
| 2006/0137608 A1 | 6/2006 | Choi et al. | |
| 2006/0137609 A1 | 6/2006 | Puchacz et al. | |
| 2006/0157340 A1 | 7/2006 | Kurita et al. | |
| 2006/0201074 A1 | 9/2006 | Kurita et al. | |
| 2006/0263177 A1 | 11/2006 | Meulen | |
| 2007/0020890 A1 | 1/2007 | Thakur et al. | |
| 2007/0215036 A1 | 9/2007 | Park et al. | |
| 2007/0281090 A1 | 12/2007 | Kurita et al. | |
| 2008/0014055 A1 | 1/2008 | van der Meulen | |
| 2008/0072821 A1 | 3/2008 | Dalton et al. | |
| 2008/0124194 A1 | 5/2008 | van der Meulen et al. | |
| 2008/0124197 A1 | 5/2008 | van der Meulen et al. | |
| 2008/0138176 A1 | 6/2008 | Kim et al. | |
| 2008/0187417 A1 | 8/2008 | van der Meulen et al. | |
| 2008/0219808 A1 | 9/2008 | van der Meulen et al. | |
| 2008/0219812 A1 | 9/2008 | van der Meulen et al. | |
| 2008/0226429 A1 | 9/2008 | van der Meulen | |
| 2008/0232947 A1 | 9/2008 | van der Meulen et al. | |
| 2009/0087286 A1 | 4/2009 | van der Meulen | |
| 2009/0173622 A1 | 7/2009 | Weichart et al. | |
| 2009/0180847 A1 | 7/2009 | Guo et al. | |
| 2010/0012036 A1 | 1/2010 | Silva et al. | |
| 2010/0075453 A1 | 3/2010 | Kurita et al. | |
| 2010/0120238 A1 | 5/2010 | Kitano et al. | |
| 2010/0281683 A1 | 11/2010 | White et al. | |
| 2010/0304027 A1 | 12/2010 | Lee et al. | |
| 2010/0327187 A1 | 12/2010 | Beloussov et al. | |
| 2012/0027542 A1 | 2/2012 | Isomura et al. | |
| 2012/0031749 A1 | 2/2012 | Dubs et al. | |
| 2012/0328797 A1 | 12/2012 | Maass et al. | |
| 2013/0088809 A1 | 4/2013 | Parkhe et al. | |
| 2013/0302115 A1 | 11/2013 | Wakabayashi et al. | |
| 2014/0262035 A1 | 9/2014 | Merry et al. | |
| 2014/0349011 A1 | 11/2014 | Weichart | |
| 2015/0063957 A1 | 3/2015 | Olgado | |
| 2015/0240360 A1 | 8/2015 | Leeser | |
| 2016/0108515 A1 | 4/2016 | Elghazzali et al. | |
| 2016/0138159 A1 | 5/2016 | Kato et al. | |
| 2017/0140954 A1* | 5/2017 | Kitagawa | H01J 37/32009 |
| 2017/0175247 A1 | 6/2017 | Weichart | |
| 2017/0218514 A1 | 8/2017 | Kato et al. | |
| 2017/0345668 A1* | 11/2017 | Takebayashi | H01L 21/67248 |
| 2018/0142350 A1 | 5/2018 | Fukiage et al. | |
| 2018/0195173 A1 | 7/2018 | Kato et al. | |
| 2018/0245212 A1 | 8/2018 | Schwyn-Thony et al. | |
| 2018/0245218 A1 | 8/2018 | Kato | |
| 2018/0261473 A1 | 9/2018 | Weichart et al. | |

(56) References Cited

U.S. PATENT DOCUMENTS

| | | |
|---|---|---|
| 2018/0334745 A1 | 11/2018 | Kato |
| 2019/0013225 A1 | 1/2019 | Taguchi et al. |
| 2019/0096715 A1 | 3/2019 | Lodder et al. |
| 2019/0252160 A1 | 8/2019 | Balon et al. |
| 2019/0252166 A1 | 8/2019 | Felzer et al. |
| 2021/0375599 A1* | 12/2021 | Noujaim ........... H01L 21/67103 |

FOREIGN PATENT DOCUMENTS

| | | |
|---|---|---|
| CN | 105200393 B | 10/2018 |
| DE | 10350517 A1 | 6/2005 |
| DE | 102012103295 A1 | 7/2013 |
| DE | 102013111790 A1 | 4/2015 |
| DE | 102013113052 A1 | 5/2015 |
| EP | 2102889 A2 | 9/2009 |
| JP | 5088284 B2 | 12/2012 |
| JP | 5315898 B2 | 10/2013 |
| JP | 5544697 B2 | 7/2014 |
| JP | 5870568 B2 | 3/2016 |
| JP | 2016076646 A | 5/2016 |
| JP | 6330623 B2 | 5/2018 |
| JP | 6464765 B2 | 2/2019 |
| JP | 6478847 B2 | 3/2019 |
| JP | 2019036630 B2 | 3/2019 |
| KR | 101796647 B1 | 11/2017 |
| KR | 101887072 B1 | 8/2018 |
| WO | 0137317 A1 | 5/2001 |
| WO | 2017212077 A2 | 12/2017 |
| WO | 2018197305 A2 | 11/2018 |
| WO | 2019020391 A1 | 1/2019 |
| WO | 2019020393 A1 | 1/2019 |
| WO | 2019096515 A1 | 5/2019 |
| WO | 2019096564 A1 | 5/2019 |
| WO | 2019105671 A1 | 6/2019 |
| WO | 2019181525 A1 | 9/2019 |

OTHER PUBLICATIONS

International Search Report and Written Opinion dated Sep. 4, 2020 for Application No. PCT/US2020/033456.

* cited by examiner

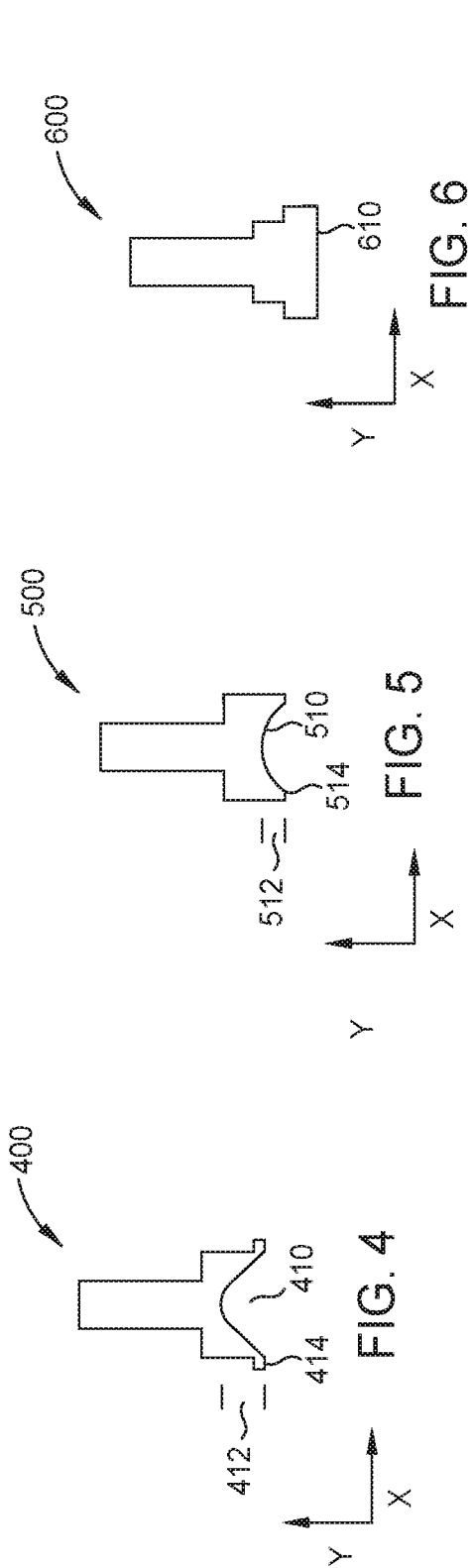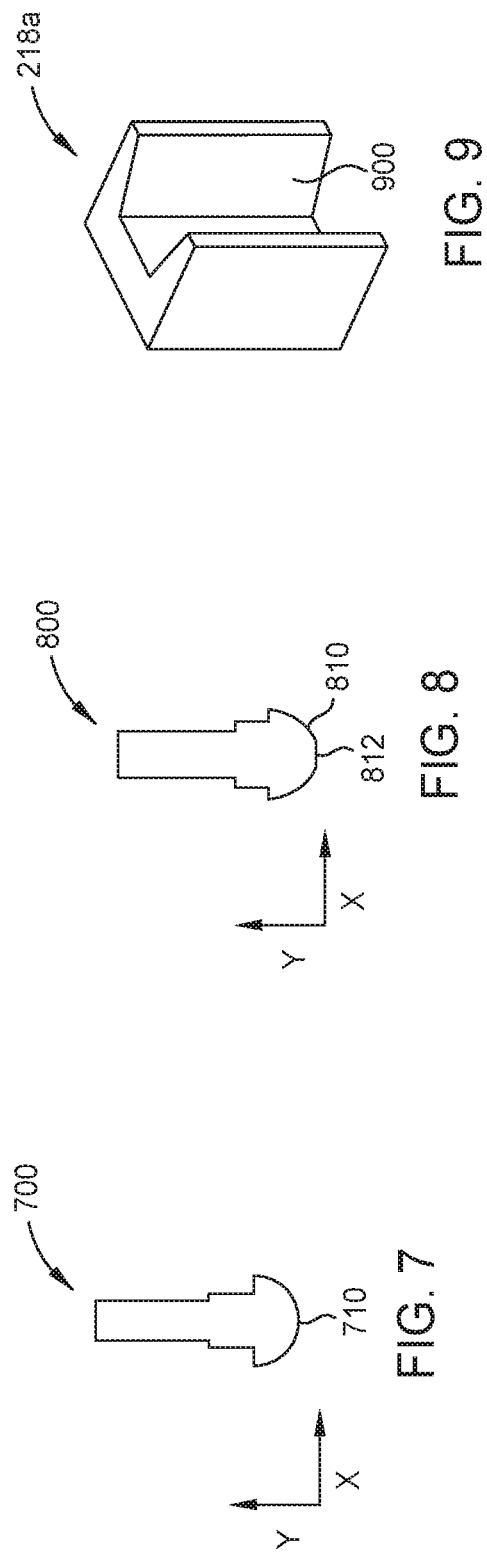

ELECTROSTATIC CHUCK HAVING A HEATING AND CHUCKING CAPABILITIES

BACKGROUND

Field

Embodiments of the present disclosure generally relate to methods and apparatus for processing substrates. Embodiments of the disclosure relate to substrate processing platforms, which use multiple processing chambers for processing substrates. More particularly, embodiments of the disclosure relate to electrostatic chucks for such processing chambers.

Description of the Related Art

Conventional semiconductor wafer processing equipment, typically referred to as cluster tools, are configured to perform one or more processes during substrate processing. For example, a cluster tool can include a physical vapor deposition (PVD) chamber for performing a PVD process on a substrate, an atomic layer deposition (ALD) chamber for performing an ALD process on a substrate, a chemical vapor deposition (CVD) chamber for performing a CVD process on a substrate, and/or one or more other processing chambers for performing one or more other processes on a substrate.

In semiconductor wafer processing equipment, substrate supports are used for retaining substrates (or wafers) during processing. The substrate rests on a susceptor, for example an electrostatic chuck. Electrostatic chucks (or chuck) secure a substrate by creating an electrostatic attractive force between the substrate and the electrostatic chuck. A voltage applied to one or more insulated electrodes in the electrostatic chuck induces opposite polarity charges in the surface of the substrate and substrate supporting surface of the electrostatic chuck, respectively. The opposite charges generate a "chucking force" which causes the substrate to be pulled onto or attracted to the substrate supporting surface of the electrostatic chuck, thereby retaining the substrate. Conventional electrostatic chuck designs include assemblies that are inseparable due to the need to form good thermal and electrical coupling with various internal (e.g., cooling channels, electrical wires/leads connections) and external components (e.g., power supplies), and allow portions of the electrostatic chuck assembly to be disposed within a vacuum environment.

Many thin film deposition and etch processes performed in conventional semiconductor wafer processing equipment employ single substrate processing chambers that are attached to a mainframe of the cluster tool, wherein a single substrate is loaded into a dedicated vacuum process chamber having dedicated hardware therein to support the substrate during a process performed thereon. The time required to load and unload the substrate from the dedicated chamber using a robot that is able to pick up and transfer one wafer at a time, which commonly includes the time needed to chuck and de-chuck the substrate from the substrate support in each process chamber, adds overhead time to the total time required to process a substrate in a cluster tool, decreases throughput, and increases cost of ownership (CoO).

Thus, the aforementioned cluster tools and substrate supporting hardware have limitations, such as mechanical throughput, thermal stability during processing, and process flexibility. Therefore, what is needed in the art is a transfer apparatus for the cluster tool capable of improving the mechanical throughput, thermal stability, and increasing process flexibility. Thus, there is also a need for a substrate support assembly and substrate transfer mechanism, and method of using the same, that solves the problems described above.

SUMMARY

In one example, an electrostatic chuck comprises a chuck body having a top surface configured to support a substrate and a bottom surface opposite the top surface. The chuck body comprises one or more chucking electrodes, and one or more heating elements. The chuck body further comprises first terminals disposed on the bottom surface of the chuck body and coupled with the one or more heating elements, second terminals disposed on the bottom surface of the chuck body and coupled with the one or more chucking electrodes, and third terminals disposed on the bottom first surface of the chuck body and coupled with the one or more chucking electrodes.

In one example, a processing region comprises a pedestal assembly configured to move between a loading position and a processing position. The pedestal assembly comprises a substrate support comprising first pins coupled to a first power supply and second pins coupled to a second power supply. The processing region further comprises an electrostatic chuck comprising a chuck body, first terminals, second terminals, and third terminals. The chuck body has a top surface configured to support a substrate and a bottom surface opposite the top surface. The chuck body is configured to be supported by the substrate support and comprises one or more chucking electrodes, and one or more heating elements. The first terminals are disposed on the bottom surface of the chuck body and are coupled with the one or more heating elements. The first terminals are configured mate with the first pins of the substrate support. The second terminals are disposed on the bottom surface of the chuck body and are coupled with the one or more chucking electrodes. The second terminals are configured to mate with the second pins of the substrate support. The third terminals are disposed on the bottom first surface of the chuck body and are coupled with the one or more chucking electrodes.

In one example, a cluster tool assembly comprises a processing region. The processing region comprises a pedestal assembly configured to move between a loading position and a processing position. The pedestal assembly comprises a substrate support comprising first pins coupled to a first power supply and second pins coupled to a second power supply. The processing region further comprises an electrostatic chuck comprising a chuck body, first terminals, second terminals, and third terminals. The chuck body has a top surface configured to support a substrate and a bottom surface opposite the top surface. The chuck body is configured to be supported by the substrate support, and comprises one or more chucking electrodes, and one or more heating elements. The first terminals are disposed on the bottom surface of the chuck body and are coupled with the one or more heating elements. The first terminals are configured mate with the first pins of the substrate support. The second terminals are disposed on the bottom surface of the chuck body and are coupled with the one or more chucking electrodes. The second terminals are configured to mate with the second pins of the substrate support. The third terminals are disposed on the bottom first surface of the chuck body and are coupled with the one or more chucking electrodes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 4, 5, 6, 7, and 8 are example terminals, according to one or more embodiments.

FIG. 9 is an example centering element, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
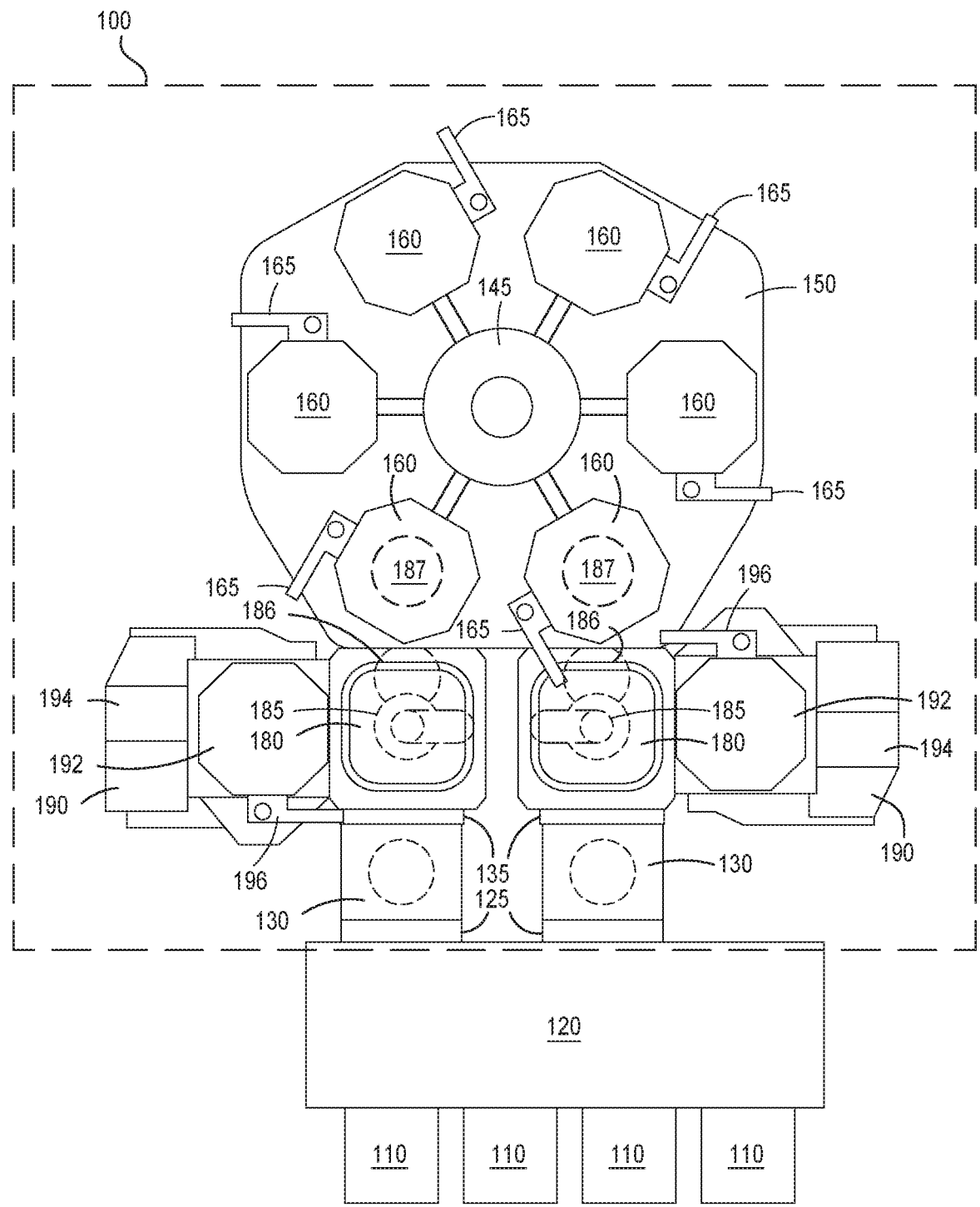
FIG. 1 is a plan view of a cluster tool assembly according to one or more embodiments.

Before describing several exemplary embodiments of the apparatus and methods, it is to be understood that the disclosure is not limited to the details of construction or process steps set forth in the following description. It is envisioned that some embodiments of the present disclosure may be combined with other embodiments. Aspects of the disclosure provided herein generally provide a substrate processing system that includes at least one processing module that includes a plurality of processing regions coupled thereto and a substrate transferring device disposed within a transfer region of the processing module for transferring a plurality of substrates to two or more of the plurality of processing regions. The methods and apparatuses disclosed herein are useful for performing vacuum processing on substrates wherein one or more substrates are transferred within the transfer region of processing module that is in direct communication with at least a portion of a processing region of a plurality of separately isolatable processing regions during the process of transferring the one or more substrates. In some embodiments, a substrate is positioned and maintained on the same substrate support member (hereafter electrostatic chuck) during the process of transferring the substrate within the processing module and while the substrate is being processed in each of the plurality of processing regions.

In the substrate processing system, or cluster tool assembly 100, both an electrostatic chuck and a substrate are transferred between processing chambers of the cluster tool assembly 100. As is discussed further below, when the electrostatic chuck and substrate are transferred between processing chambers, the terminals of the electrostatic chuck mate with pins of a substrate support to allow an electrical connection to be formed therebetween. The pins of the substrate support provide power signals to the terminals of the electrostatic chuck. As is discussed further below, in some embodiments, the pins of the substrate support are configured to support a portion of the weight of the electrostatic chuck to ensure that the electrical connection between the pins of the substrate support and the terminals of the electrostatic chuck allows power signals to be repeatedly and reliably transferred.

One or more embodiments of the present disclosure are directed towards an apparatus for substrate processing and a cluster tool assembly 100 including a transfer apparatus and a plurality of processing regions. The transfer apparatus is configured as a carousel in some embodiments, and the processing regions may include facilities to enable atomic layer deposition (ALD), chemical vapor deposition (CVD), physical vapor deposition (PVD), etch, cleaning, heating, annealing, and/or polishing processes. Other processing platforms may also be used with the present disclosure at the discretion of a user. The present disclosure is generally meant to provide a substrate processing tool with high throughput, increased adaptability, and a smaller footprint.

FIG. 1 is a plan view of a cluster tool assembly 100 with a single transfer chamber assembly 150. The cluster tool assembly 100 includes a plurality of load lock chambers 130 adjacent to a Factory Interface (FI) 120, a plurality of robot chambers 180 adjacent to the plurality of load lock chambers 130, a plurality of prep chambers 190 adjacent to the plurality of robot chambers 180, and the transfer chamber assembly 150 adjacent to the plurality of robot chambers 180. The load lock chambers 130 of the cluster tool assembly 100 are typically coupled to a plurality of Front Opening Unified Pods (FOUPs) 110 by the FI 120 adjacent to the FOUPs 110.

The plurality of FOUPs 110 may be utilized to safely secure and store substrates as the substrates are moved between different machines. The plurality of FOUPs 110 may vary in quantity depending upon the process and throughput of the system. The FI 120 is disposed between the plurality of FOUPs 110 and the plurality of load lock chambers 130. The FI 120 creates an interface between the factory and the cluster tool assembly 100. The plurality of load lock chambers 130 are connected to the FI 120 by first valves 125, such that a substrate may be transferred from the FI 120 to the plurality of load lock chambers 130 through the first valves 125 and from the plurality of load lock chambers 130 to the FI 120. As shown, the first valves 125 are on one wall of the load lock chambers 130. In some embodiments, the first valves 125 are fluid isolation valves and may form a seal between the FI 120 and the load lock chambers 130. This seal may keep outside contaminants from entering the cluster tool assembly 100. The load lock chambers 130 also comprise a second valve 135 on an opposite wall from the first valve 125. The second valve 135 interfaces the load lock chambers 130 with the robot chambers 180.

The transfer chamber assembly 150 includes a central transfer apparatus 145 and a plurality of processing regions

160. The plurality of processing regions 160 are disposed around the central transfer apparatus 145, such that the plurality of processing regions 160 are disposed radially outward of the central transfer apparatus 145 in the transfer chamber assembly 150.

As shown, the robot chambers 180 are on one side of the load lock chambers 130, such that the load lock chambers 130 are between the FI 120 and the robot chambers 180. The robot chambers 180 include a transfer robot 185. The transfer robot 185 may be any robot suitable to transfer one or more substrates from one chamber to another. The transfer robot 185 is utilized to transfer substrates 186 to an electrostatic chuck (e.g., electrostatic chuck) 187 that is temporarily connected to the central transfer apparatus 145. The connection between the electrostatic chuck 187 and the central transfer apparatus 145 is described below in more detail. The electrostatic chuck 187 holds a single substrate 186 and travels with the substrate 186 into each of the processing regions 160. The electrostatic chuck 187, when in one of the processing regions 160 (with a substrate thereon), forms a boundary of the processing region 160. The substrates 186 are mated with one of electrostatic chucks 187, and the substrate 186 moves in and between the processing regions 160 on that electrostatic chuck 187.

In some embodiments, the transfer robot 185 is configured to transport substrates 186 from the load lock chambers 130 and into the plurality of prep chambers 190. The transfer robot 185 removes the substrate 186 from the load lock chambers 130, moves the substrate 186 into the robot chamber 180, and then moves the substrate 186 into the prep chamber 190. The transfer robot 185 is also configured to move substrates 186 to the transfer chamber assembly 150. Similarly to how the substrate 186 may be moved to the prep chambers 190 from the load lock chambers 130 by the transfer robot 185, the substrate 186 may also be moved from the prep chamber 190 to the load lock chambers 130 by the transfer robot 185. The transfer robot 185 may also move substrates 186 from the transfer chamber assembly 150 to the prep chambers 190 or the load lock chambers 130. In some alternative embodiments, the transfer robot 185 may move a substrate 186 from the load lock chambers 130, move the substrate 186 into the robot chamber 180, and then move the substrate 186 into the transfer chamber assembly 150. In this alternative embodiment, the substrate 186 may not enter the prep chamber 190 either before processing in the transfer chamber assembly 150 or after processing in the transfer chamber assembly 150.

The prep chambers 190 include a cleaning chamber 192, a packaging structure 194, and a cleaning chamber vacuum pump 196. The cleaning chamber 192 may be any one of a pre-clean chamber, an anneal chamber, or a cool down chamber, depending upon the desired process within the cluster tool assembly 100. In some embodiments, the cleaning chamber 192 is a wet clean chamber. In other embodiments, the cleaning chamber 192 is a plasma clean chamber. In yet other exemplary embodiments, the cleaning chamber 192 is a Preclean II chamber available from Applied Materials, Inc., of Santa Clara, Calif.

The packaging structure 194 may be a structural support for the cleaning chamber 192. The packaging structure 194 may include a sub-transfer chamber (not shown), a gas supply (not shown), and an exhaust port (not shown). The packaging structure 194 may provide the structure around the cleaning chamber 192 and interface the cleaning chamber 192 to the robot chamber 180. The cleaning chamber vacuum pump 196 is disposed adjacent to a wall of the cleaning chamber 192 and provides control of the pressure within the cleaning chamber 192. One cleaning chamber vacuum pump 196 may be adjacent to each of the cleaning chambers 192. The cleaning chamber vacuum pump 196 may be configured to provide a pressure change to the cleaning chamber 192. In some embodiments, the cleaning chamber vacuum pump 196 is configured to increase the pressure of the cleaning chamber 192. In other embodiments, the cleaning chamber vacuum pump 196 is configured to decrease the pressure of the cleaning chamber 192, such as to create a vacuum within the cleaning chamber 192. In yet other embodiments, the cleaning chamber vacuum pump 196 is configured to both increase and decrease the pressure of the cleaning chamber 192 depending on the process being utilized within the cluster tool assembly 100. The cleaning chamber vacuum pump 196 may be held in place by the packaging structure 194, such that the packaging structure 194 at least partially surrounds the cleaning chamber vacuum pump 196.

The load lock chambers 130, robot chambers 180, and prep chambers 190 may be arranged to reduce the footprint required for the cluster tool assembly 100. In one embodiment, one load lock chamber 130 is attached to a first wall of the robot chamber 180. One prep chamber 190 is attached to a second wall of the robot chamber 180. The first and second walls may be adjacent walls on the robot chamber 180. In some embodiments, the robot chamber 180 is roughly square shaped. In other embodiments, the robot chamber 180 is a quadrilateral. In yet other embodiments, the robot chambers 180 may be any desired shape, such as a polygon or a round shape, such as a circle. In an embodiment where the robot chambers 180 are a square or quadrilateral shape, the first wall and the second wall may be adjacent walls, such that the two walls intersect each other. As shown in FIG. 1, the cluster tool assembly 100 includes two load lock chambers 130, two robot chambers 180, and two cleaning chambers 190. The two load lock chambers 130, two robot chambers 180, and two cleaning chambers 190, when arranged as described above, form two transport assemblies. The two transport assemblies are spaced apart from each other and form mirror images of one another, such that the prep chambers 190 are on opposite walls of their respective robot chambers 180.

As shown, the transfer chamber assembly 150 is adjacent to the robot chambers 180, such that the transfer chamber assembly 150 is connected to the robot chambers 180 by a valve (not shown). The transfer chamber assembly 150 may be attached to a third wall of the robot chambers 180. The third wall of the robot chambers 180 may be opposite the first wall of the robot chambers 180.

A chamber pump 165 is disposed adjacent to each of the processing regions 160, such that a plurality of chamber pumps 165 are disposed around the central transfer apparatus 145. The plurality of chamber pumps 165 may also be disposed radially outward of the central transfer apparatus 145 in the transfer chamber assembly 150. One chamber pump 165 for each of the processing regions 160, such that one chamber pump 165 is connected to each of the processing regions 160 is provided. In some embodiments, multiple chamber pumps 165 per processing region 160 are provided. In yet other embodiments, a processing region 160 may not have a chamber pump 165. There may be a varying number of chamber pumps 165 per processing region 160, such that one or more processing regions 160 may have a different number of chamber pumps 165 than a separate set of processing regions 160. In some embodiments, the chamber pumps 165 are configured to increase the pressure of the processing region 160. In other embodiments, the chamber pumps 196 are configured to decrease the pressure of the processing region 160, such as to create a vacuum within the processing region 160. In yet other embodiments, the chamber pumps 165 are configured to both increase and decrease the pressure of the processing regions 160 depending on the process being utilized within the cluster tool assembly 100.

In the embodiment shown in FIG. 1, the transfer chamber assembly 150 includes six processing regions 160. In one embodiment, the transfer chamber assembly 150 includes a single processing region 160. In another embodiment, two or processing regions 160 are provided. In some embodiments two to twelve processing regions 160 are within the transfer chamber assembly 150. In other embodiments, four to eight processing regions 160 are within the transfer chamber assembly 150. The number of processing regions 160 impacts the total footprint of the cluster tool assembly 100, the number of possible process steps capable of being performed by the cluster tool assembly 100, the total fabrication cost of the cluster tool, and the throughput of the cluster tool assembly 100.

The plurality of processing regions 160 can be any one of PVD, CVD, ALD, etch, cleaning, heating, annealing, and/or polishing platforms. In some embodiments, the plurality of processing regions 160 can all be similar platforms. In other embodiments, the plurality of processing regions 160 can include two or more types of processing platforms. In one exemplary embodiment, all of the plurality of processing regions 160 are PVD process chambers. In another exemplary embodiment, the plurality of processing regions 160 includes both PVD and CVD process chambers. Other embodiments of the makeup of the plurality of processing regions 160 are envisioned. The plurality of processing regions 160 can be altered to match the types of process chambers needed to complete a process.

The central transfer apparatus 145 is disposed in the center of the transfer chamber assembly 150, such that the central transfer apparatus 145 is disposed around a central axis of the transfer chamber assembly 150. The central transfer apparatus 145, may be any suitable transfer device. The central transfer apparatus 145 is configured to transport a substrate 186 on an electrostatic chuck 187 to and from each of the processing regions 160. In one embodiment, the central transfer apparatus 145 is configured as a carousel system having one or more transfer arms (e.g., the transfer arm 1110 of FIG. 11). Each transfer arm supports a corresponding electrostatic chuck 187 and substrate 186 as the electrostatic chucks 187 and the substrates 186 transferred between processing regions 160. The transfer arms provide one or more power signals to the electrostatic chuck 187 to power heating elements (e.g., heating elements 272 of FIG. 2) and/or chucking electrodes (e.g., chucking electrodes 270 of FIG. 2).

Figure 2:
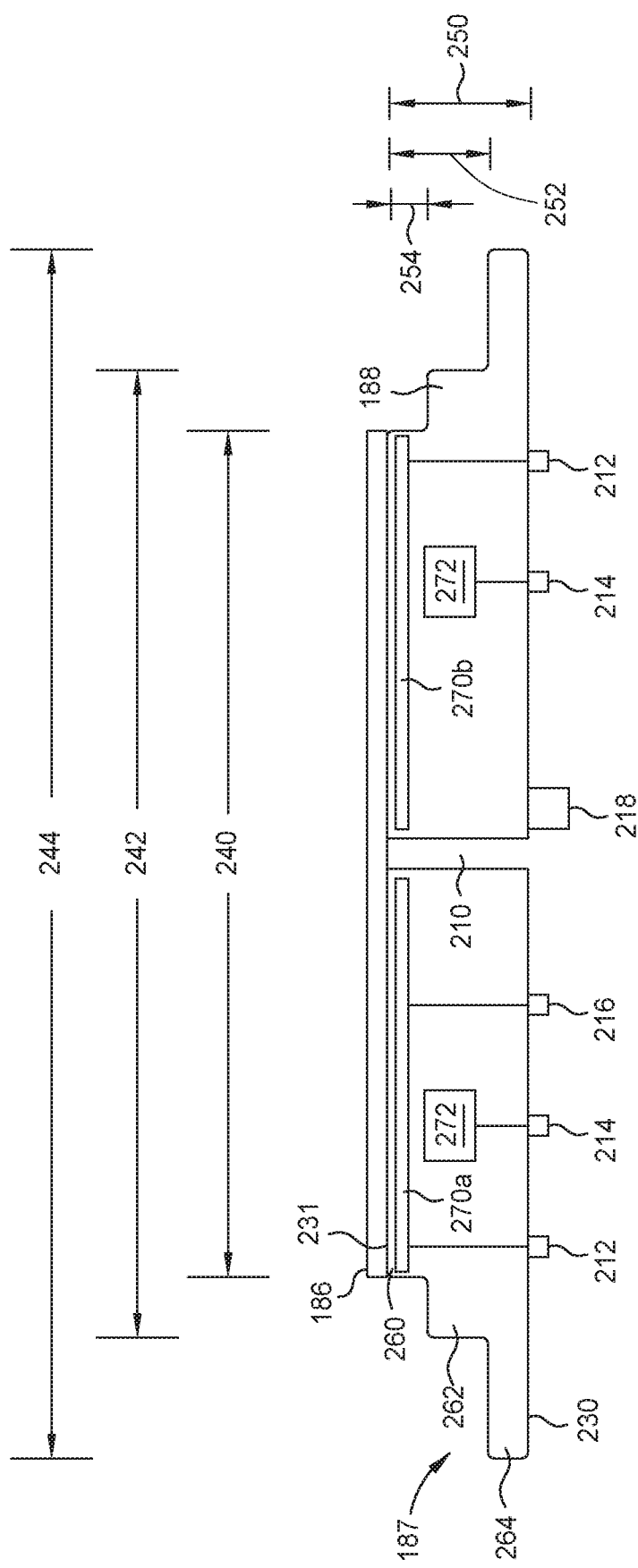
FIG. 2 is a side view of an electrostatic chuck, according to one or more embodiments.

FIG. 2 illustrates a cross-sectional side view of the electrostatic chuck 187 and the substrate 186, according to one or more embodiments. The electrostatic chuck 187 includes a body (e.g., chuck body) 188, terminals 212, terminals 214, terminals 216, and centering elements 218. The body 188 includes a top surface 231 configured to support the substrate 186. The body 188 includes a bottom surface 230 that is opposite the top surface 231. The terminals 212, 214, and 216 and the centering elements 218 are disposed on the bottom surface 230. The body 188 of the electrostatic chuck 187 additionally includes a passageway (i.e., aperture) 210, one or more chucking electrodes 270, and one or more heating elements 272.

The one or more chucking electrodes 270 may include a single chucking electrode 270. Alternatively, the one or more chucking electrodes 270 includes two or more chucking electrodes (e.g., the chucking electrodes 270a and 270b). In embodiments where the one or more chucking electrode 270 includes two or more chucking electrodes, the chucking electrodes are interdigitated with each other. Alternatively, the chucking electrodes 270 are not interdigitated with each other. The chucking electrodes 270 may be co-planer. Alternatively, the chucking electrodes 270 may be disposed in different layers within the electrostatic chuck 187 such that one chucking electrode 270 is closer to the top surface 231 than another chucking electrode 270.

The terminals 212 and 216 are electrically coupled to the one or more chucking electrodes 270. A first one of the terminals 212 and 216 may be coupled to a first chucking electrode 270 and a second one of the terminals 212 and 216 may be coupled to a second chucking electrode 270. For example, a first one of the terminals 212 and 216 is coupled to the chucking electrode 270a and a second one of the terminals 212 and 216 is coupled to the chucking electrode 270b. As shown, one or more of the terminals 212 and one or more of the terminals 216 are coupled to a common chucking electrode 270. For example, a first one of the terminals 212 and a first one of the terminals 216 are coupled to the chucking electrode 270a and a second one of the terminals 214 and a second one of the terminals 216 are coupled to the chucking electrode 270b.

The terminals 214 are electrically coupled to the heating elements 272. The heating elements 272 are resistive heating elements. Alternatively, the heating elements 272 are other types of heating elements. A first one of the terminals 214 may be coupled to a first one of the heating elements 272 and a second one of the terminals 214 may be coupled to a second one of the heating elements 272. In one embodiment, each of the terminals 214 is coupled to a common heating element 272.

The body 188 of the electrostatic chuck 187 may be formed from a single piece of a material. Alternatively, the body 188 of the electrostatic chuck 187 is formed from multiple layers of a common material or different materials. For example, the electrostatic chuck 187 includes regions (e.g., stepped regions) 260, 262 and 264. The one or more regions 260, 262, and 264 may be separate pieces that are adhered together. Alternatively, two or more of the regions 260, 262, and 264 are formed from a common piece of material.

Figure 3A:
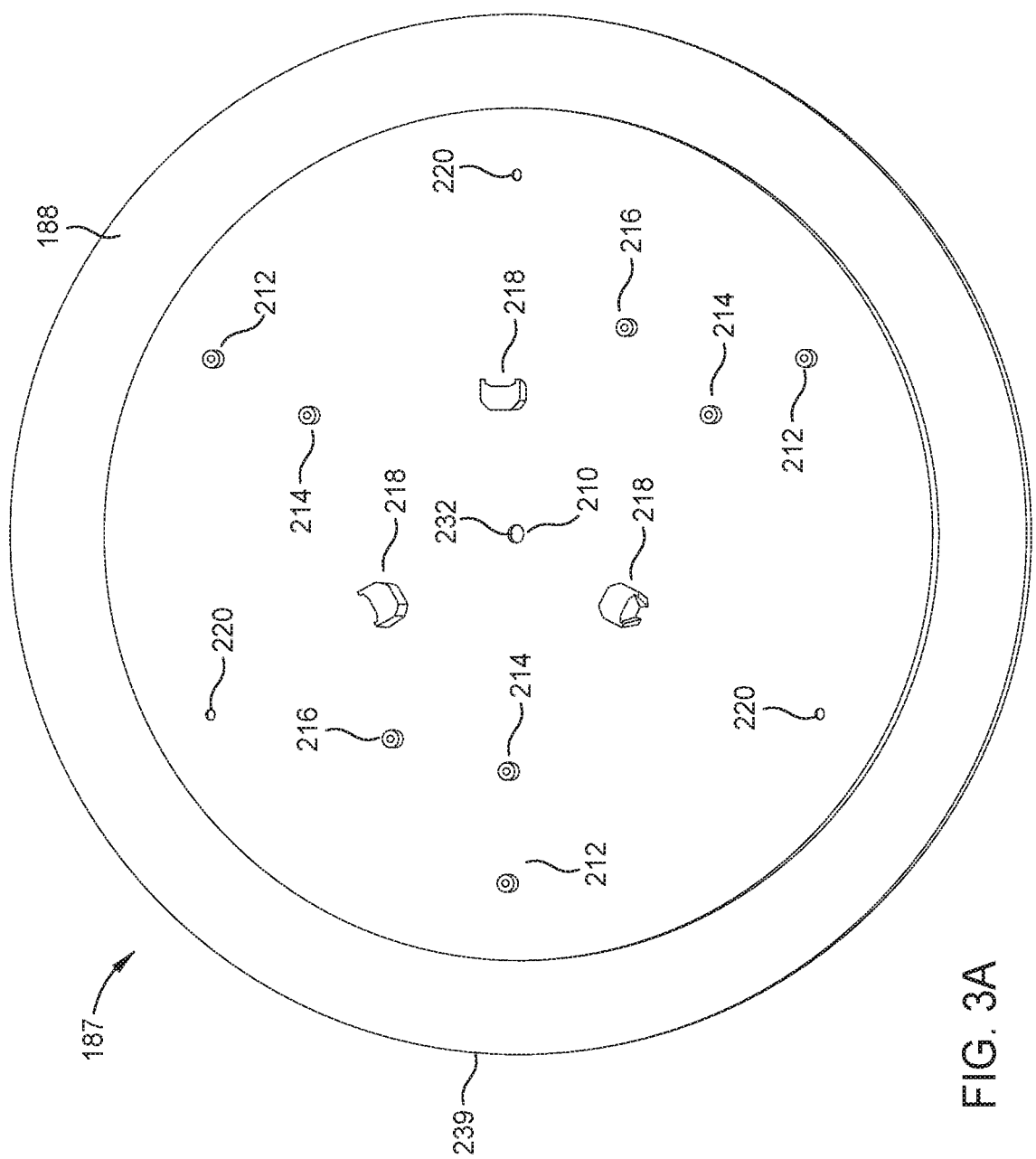
FIG. 3A is bottom view of an electrostatic chuck, according to one or more embodiments.
Figure 3B:
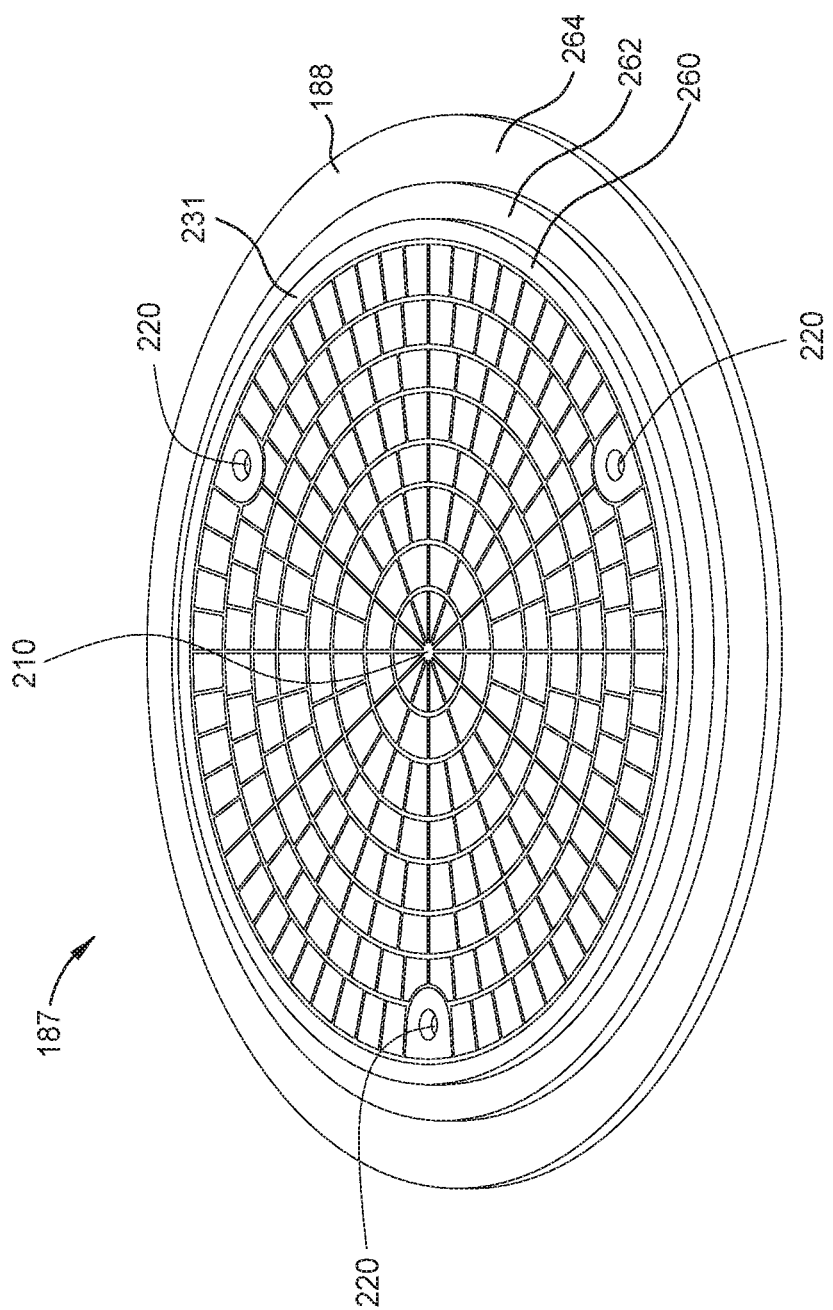
FIG. 3B is a top isometric view of an electrostatic chuck, according to one or more embodiments.

FIG. 3A illustrates a bottom plane view and FIG. 3B illustrates a top isometric view of the electrostatic chuck 187, according to one or more embodiments. As illustrated, the electrostatic chuck 187 includes three terminals 212. In other embodiments, the electrostatic chuck 187 includes more or less than three terminals 212. The terminals 212 may be positioned such that each of the terminals 212 is an equal distance from each other. Alternatively, the distance between a first two of the terminals 212 may differ from the distance between a second two of the terminals 212. Further, the terminals may be positioned such that each of the terminals 212 is an equal distance from the center point 232 of the electrostatic chuck 187. Alternatively, the distance between two or more of the terminals 212 and the center point 232 may be different.

Further, the electrostatic chuck 187 includes three terminals 214. In other embodiments, the electrostatic chuck 187 includes more or less than three terminals 214. The terminals 214 may be positioned such that each of the terminals 214 is an equal distance from each other. Alternatively, a distance between a first two of the terminals 214 is different than a distance between a second two of the terminals 214. Additionally, or alternatively, the terminals 214 may be positioned such that each of the terminals 214 is an equal distance from the center point 232. Alternatively, the distance between two or more of the terminals 212 and the center point 232 may be different.

The distance between each of the terminals 214 may be less than the distance between each of the terminals 212. Additionally, the distance between each of the terminals 214 and the center point 232 may be less than the distance between each of the terminals 212 and the center point 232. Further, the terminals 212 are closer to the edge 239 of the electrostatic chuck 187 than the terminals 214.

The electrostatic chuck 187 includes two terminals 216. In one embodiment, the electrostatic chuck 187 includes more than two terminals 216. The terminals 216 may be positioned such that each of the terminals 216 is an equal distance from the center point 232. Alternatively, the distance between each of the terminals 216 and the center point 232 may be different. The terminals 216 are closer to the center point 232 than the terminals 212. The terminals 212 are closer to the edge 239 of the electrostatic chuck 187 than the terminals 216.

The terminals 212, 214, and 216 are removably or non-removably attached to the bottom surface 230 of the electrostatic chuck 187. For example, one or more of the terminals 212, 214, and 216 may be attached to and removed from the bottom surface 230 of the electrostatic chuck 187. In one embodiment, each of the terminals 212, 214, and 216 is removably attached to the bottom surface 230 of the electrostatic chuck 187. Alternatively, one or more of the terminals 212, 214, and 216 is non-removably attached to the bottom surface 230 of the electrostatic chuck 187. For example, one or more of the terminals 212, 214, and 216 are attached to the bottom surface 230 of the electrostatic chuck 187 such that the terminals 212, 214, and 216 cannot be removed from the bottom surface 230 of the electrostatic chuck 187 without damaging the electrostatic chuck 187 or the terminals 212, 214, and 216. In one or more embodiments, a first one or more of the terminals 212, 214, and 216 is removably attached to the bottom surface 230 of the electrostatic chuck 187 and a second one or more of the terminals 212, 214, and 216 is non-removably attached to the bottom surface 230 of the electrostatic chuck 187.

With further reference to FIG. 2 and FIG. 3B, the electrostatic chuck 187 includes regions (or steps) 260, 262, and 264. The electrostatic chuck 187 includes region 260 associated with a top region (e.g., top step) and the top surface 231 of the electrostatic chuck 187, region 262 associated with a middle region (e.g., middle step) of the electrostatic chuck 187, and region 264 associated with a bottom region (e.g., bottom step) and the bottom surface 230 of the electrostatic chuck 187. The region 260 is closer to the top surface 231 of the electrostatic chuck 187 than the regions 262 and 264. Further, the region 264 is closer to the bottom surface 230 of the electrostatic chuck 187 than the regions 260 and 262.

The electrostatic chuck 187 has an outer diameter 244 in a range of about 340 mm to about 375 mm. Alternatively, the outer diameter 244 is less than about 340 mm or greater than 375 mm. In one embodiment, the electrostatic chuck 187 has an outer diameter 244 of about 360 mm. In another embodiment, the electrostatic chuck 187 has an outer diameter 244 of about 365 mm. The outer diameter 244 is associated with region 264 of the electrostatic chuck 187.

The electrostatic chuck 187 has a first inner diameter 242. The first inner diameter 242 is in a range of about 315 mm to about 330 mm. Alternatively, the first inner diameter 242 is less than about 315 mm or greater than about 330 mm. In one embodiment, the first inner diameter 242 is about 294 mm. The first inner diameter 242 is associated with region 262 of the electrostatic chuck 187.

The electrostatic chuck 187 further has a second inner diameter 240. The second inner diameter 240 is in a range of about 280 mm to about 310 mm. Alternatively, the second inner diameter 240 is less than about 280 mm or greater than about 310 mm. In one embodiment, the second inner diameter 240 is about 294 mm. Further, the second inner diameter 240 is associated with the region 260 of the electrostatic chuck 187.

The height 250 of the electrostatic chuck 187 is in a range of about 12 mm to about 18 mm. Alternatively, the height 250 may be less than 12 mm or greater than 18 mm. In one embodiment, the height 250 is about 12.5 mm. In another embodiment, the height 250 is about 15.24 mm. In yet another embodiment, the height 250 is about 17.78 mm. The height 250 corresponds to a total height of the electrostatic chuck 187.

The height 252 of the electrostatic chuck 187 is in a range of about 10 mm to about 13 mm. Alternatively, the height 252 may be less than 10 mm or greater than 13 mm. In one embodiment, the height 252 is about 11 mm. In another embodiment, the height 252 is 12.7 mm. The height 252 corresponds to the combined height of regions 262 and 260 of the electrostatic chuck 187.

The height 254 of the electrostatic chuck 187 is in a range of about 5 mm to about 7 mm. Alternatively, the height 254 is less than about 5 mm or greater than about 7 mm. In one embodiment, the height 252 is about 6 mm. The height 254 corresponds to the height of region 260 of the electrostatic chuck 187.

FIG. 4 illustrates an example terminal 400, according to one or more embodiments. One or more of the terminals 212, 214 and 216 may be configured similar to that of the terminal 400. The surface (e.g., mating surface) of the terminal 400 is groove shaped (e.g., the mating surface is grooved) and includes groove 410. The groove 410 has a depth of 412 from the surface 414 of the terminal 400 in the +Y direction.

FIG. 5 illustrates an example terminal 500, according to one or more embodiments. One or more of the terminals 212, 214 and 216 may be configured similar to that of the terminal 500. The surface (e.g., mating surface) of the terminal 500 is concave shaped including concave area 510. The concave 410 has a depth of 512 from the surface 514 of the terminal 500 in the +Y direction.

FIG. 6 illustrates an example terminal 600, according to one or more embodiments. One or more of the terminals 212, 214 and 216 may be configured similar to that of the terminal 600. The terminal 600 includes the surface (e.g., mating surface) 610. The surface 610 is substantially flat having a flat shape. For example, the surface 610 is not convex or concave and does not substantially deviate and is substantially uniform in the +Y or −Y direction.

FIG. 7 illustrates an example terminal 700, according to one or more embodiments. One or more of the terminals 212, 214 and 216 may be configured similar to that of the terminal 700. The surface (e.g., mating surface) of the terminal 700 has a convex shape including the convex portion 710. The convex portion 710 has a radius of about 5 mm to about 20 mm. Alternatively, the convex portion 710 may have a radius of less than 5 mm or greater than 20 mm.

FIG. 8 illustrates an example terminal 800, according to one or more embodiments. One or more of the terminals 212, 214 and 216 may be configured similar to that of the terminal 800. The surface (e.g., mating surface) of the terminal 800 has a convex shape including the convex portion 810. The convex portion 810 has a radius of about 5 mm to about 20 mm. Alternatively, the convex portion 810 may have a radius of less than 5 mm or greater than 20 mm. Further, the convex portion 810 includes a flat portion 812.

The terminals 400, 500, 600, 700, and/or 800 may be comprised of molydbenum (Mo) or tungsten (W), or a combination thereof. Alternatively, the terminals 400, 500, 600, 700, and/or 800 may be comprised of a material other than Mo or W, or a combination of materials including or not including Mo and W. Further, the terminals 400, 500, 600, 700, and/or 800 has a surface roughness in a range of about 2 Ra to about 6 Ra. Alternatively, the terminals 400, 500, 600, 700, and/or 800 may have a surface roughness of less than 2 Ra or greater than about 6 Ra.

The temperature range of the processing volume 1160 is in a range of about 25 degrees Celsius to about 500 degrees Celsius. At higher temperatures, Mo and W resist oxidization, increasing the electrical contact between corresponding pins and terminals.

With further reference to FIG. 3A, the electrostatic chuck 187 includes three centering elements 218. In other embodiments, the electrostatic chuck 187 includes more or less than three center elements 218. The centering elements 218 may each be an equal distance from the center point 232. Alternatively, a distance between two or more of the centering elements 218 and the center point 232 may be different. Further, the distance between each of the centering elements 218 is the same (e.g., within manufacturing tolerances of each other). Alternatively, the distance between a first two of the centering elements 218 differs from the distance between second two of the centering elements 218.

The centering elements 218 are further from the edge 239 than the terminals 212. Further, the centering elements 218 may be further from the edge 239 than the terminals 214 and/or 216.

FIG. 9 illustrates a centering element 218a, according to one or more embodiments. The center element 218a includes slot 900. Each of the centering elements 218 may be configured similar to that of the centering element 218a of FIG. 9.

With further reference to FIG. 3A and FIG. 3B, the electrostatic chuck 187 further includes loading pin holes 220. The electrostatic chuck 187 includes at least three loading pins holes 220. Alternatively, the electrostatic chuck 187 includes less than three loading pin holes 220 or more than three loading pin holes 220. In some embodiments, the electrostatic chuck 187 does not have any loading pin holes 220.

A loading pin may pass through each of the loading pin holes 220 to receive the substrate 186 or remove the substrate 186 from the electrostatic chuck 187. The loading pin may be part of the robot chamber 180 configured to electrically chuck the substrate 186 with the electrostatic chuck 187 or de-chuck the substrate 186 from the electrostatic chuck 187.

As shown in FIG. 3B, the region 260 includes the top surface 231 and the region 264 includes the bottom surface 230. Further, the loading pins holes 220 are recessed (e.g., counter bored or countersunk).

Figure 10:
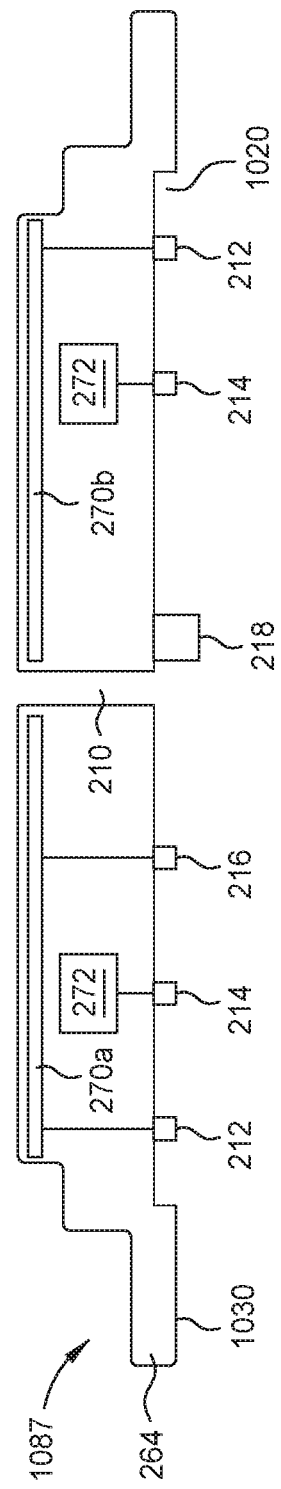
FIG. 10 is a side cross-sectional view of an electrostatic chuck, according to one or more embodiments.

FIG. 10 illustrates the electrostatic chuck 1087, according to one or more embodiments. The electrostatic chuck 1087 is configured similar to that of the electrostatic chuck 187. For example, the electrostatic chuck 1087 includes the terminals 212, the terminals 214, the terminals 216, the centering elements 218, the passageway 210, the one or more chucking electrodes 270, and the heating elements 272. However, as compared to the electrostatic chuck 187, the electrostatic chuck 1087 includes a recessed portion 1020. The recessed portion 1020 is located along the bottom surface 1030 of the electrostatic chuck 187.

Figure 11:
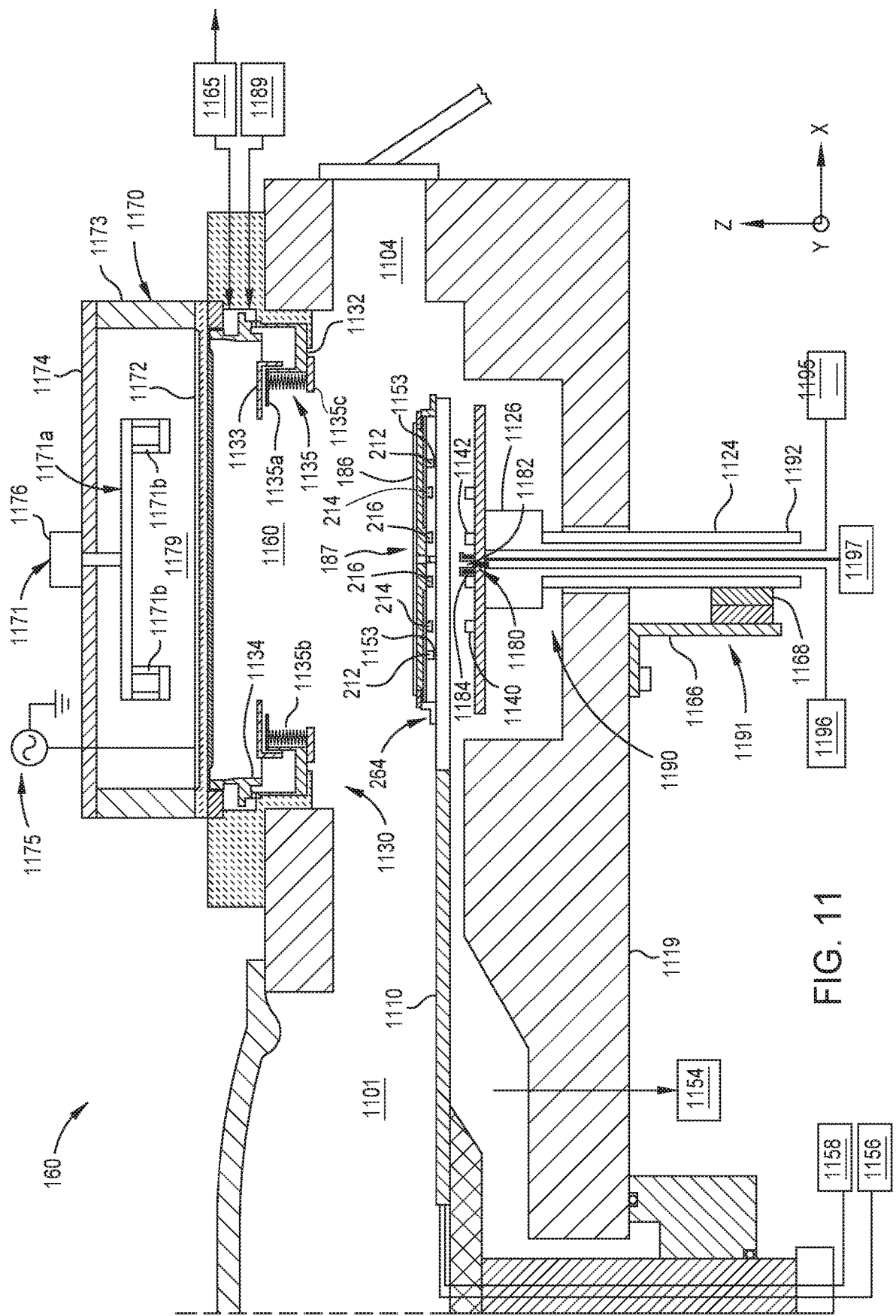
FIGS. 11 and 12 are side cross-sectional views of a processing chamber, according to one or more embodiments.

The recessed portion 1020 provides additional surface area (e.g., 264) for forming the separable seal with the sealing assembly 1135 of FIG. 11). Further, as the effects of the heating elements 272 on the region 264 differ from regions that are closer in proximity to the heating elements 272, the region 264 reduces thermal impacts on a corresponding substrate 186. Additionally, or alternatively, the recessed portion 1020 functions to aid in preventing the electrostatic chuck 187 from moving (e.g., sliding) relative to a transfer arm (e.g., the transfer arm 1110 of FIG. 11) and/or a substrate support (e.g., the substrate 1126 of FIG. 11) during rotation, and/or when any other motion is applied to the electrostatic chuck 187. The recessed portion 1020 also protects the terminals 212, 214, and 216, and other electrical and hardware components from damage during processing of a substrate 186.

Figure 12:
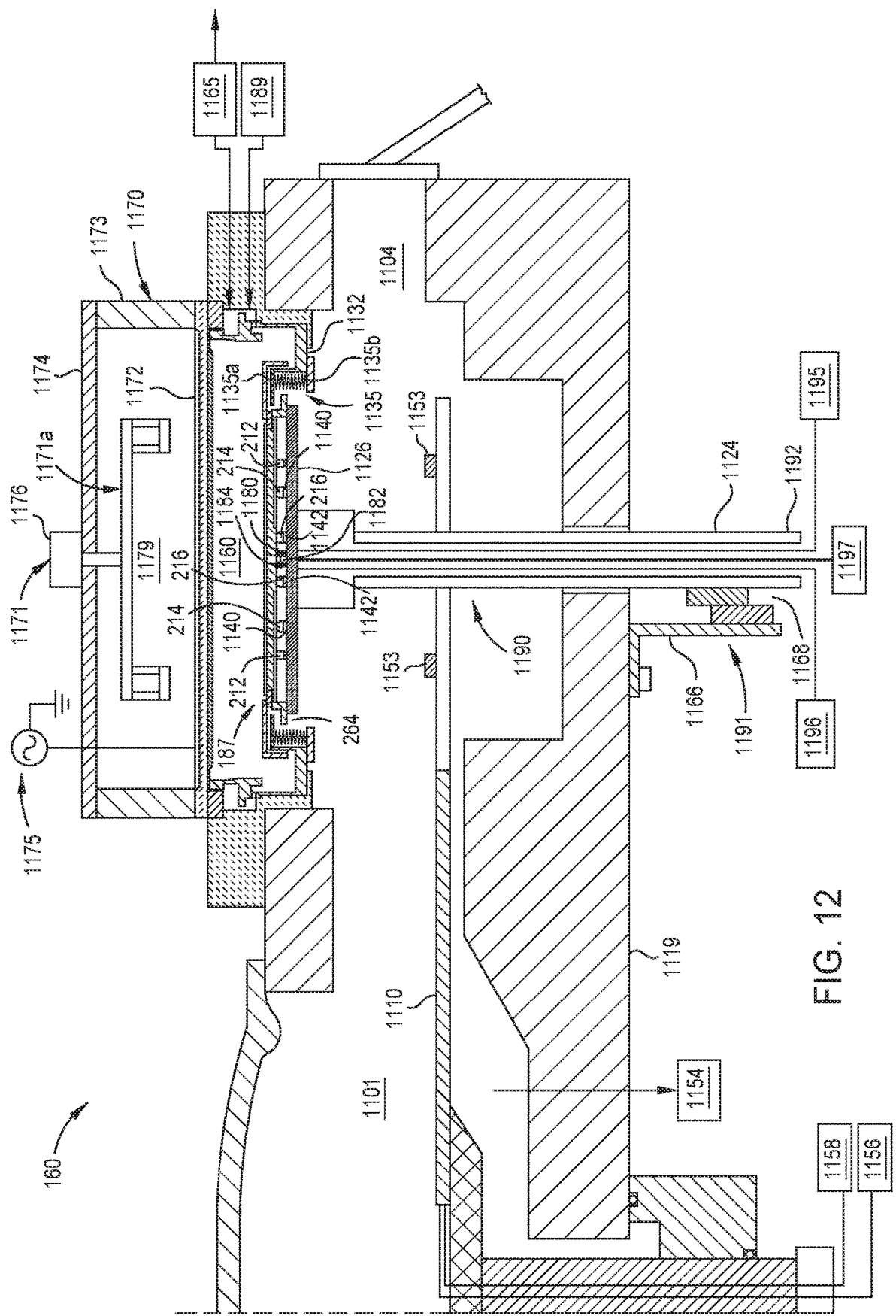

As shown in FIGS. 11 and 12, a processing region 160 is serviced via the central transfer apparatus (e.g., central transfer apparatus 145) to transfer electrostatic chucks (e.g., the electrostatic chuck 187) and substrates (e.g., the substrate 186) into and out of the processing region 160. A substrate transfer opening 1104 extends inwardly of the outer surface of a circumferential wall of the processing region 160 and into the transfer region 1101 of the processing region 160. The transfer opening 1104 allows the transfer robot 185, to transfer the substrate 186 into and out of the transfer region 1101. In various embodiments, the transfer opening 1104 may be omitted. For example, in embodiments where the processing region 160 does not interface with the transfer robot 185, the transfer opening 1104 may be omitted.

A source assembly 1170 of the processing region 160 is configured to perform a deposition process (e.g., a PVD deposition process or the like). In this configuration, the source assembly 1170 includes a target 1172, a magnetron assembly 1171, a source assembly wall 1173, a lid 1174, and a sputtering power supply 1175. The magnetron assembly 1171 includes a magnetron region 1179 in which a magnetron 1171A is rotated by use of a magnetron rotation motor 1176 during processing. The target 1172 and magnetron assembly 1171 are typically cooled by the delivery of a cooling fluid (e.g., DI water) to the magnetron region 1179 from a fluid recirculation device (not shown). The magnetron 1171A includes a plurality of magnets 1171B that are configured to generate magnetic fields that extends below the lower surface of the target 1172 to promote a sputtering process that is being performed in a processing volume 1160 during a PVD deposition process.

Alternate configurations of the processing region 160, which are adapted to perform CVD, PECVD, ALD, PEALD, etch, or thermal processes, the source assembly 1170 will generally include different hardware components. In one example, the source assembly 1170 of a processing station that is adapted to perform a PECVD deposition process or etch process will typically include a gas distribution plate, or showerhead, that is configured to deliver a precursor gas or etching gas into the processing volume 1160 and across a surface of a substrate disposed within the processing region 160 during processing. In this case, the magnetron assembly 1171 and target are not used, and the sputtering power supply 1175 can be replaced with a RF power supply that is configured to bias the gas distribution plate.

A substrate support actuation assembly 1190 includes a pedestal lift assembly 1191 and a pedestal assembly 1124. The pedestal lift assembly 1191 includes a lift actuator assembly 1168 and a lift mounting assembly 1166, which is coupled to the base 1119 of the processing region 160. During operation the lift actuator assembly 1168 and lift mounting assembly 1166 are configured to position the pedestal assembly 1124 in at least a loading position (or transfer position) (FIG. 11), which is positioned vertically (Z-direction) below a transfer arm 1110 (i.e., transfer plane), and a processing position (FIG. 12), which is vertically above the transfer arm (i.e., substrate support arm) 1110. Further, the lift actuator assembly 1168 and the lift mounting assembly 1166 apply vertical motion, in the +Z direction, to the pedestal assembly 1124 to lift the electrostatic chuck 187 off of the transfer arm 1110. Additionally, the lift actuator assembly 1168 and the lift mounting assembly 1166 apply vertical motion, in the −Z direction, to the pedestal assembly 1124 to position the electrostatic chuck 187 on the transfer arm 1110. Pins 1153 of the transfer arm 1110 mate with the terminals 212 of the electrostatic chuck 187. The pins 1153 are coupled to the power supply 1156 which provided DC power supply signals to the pins 1153. The pins 1153 couple the DC power supply signals to the terminals 212 to drive the chucking electrodes 270. A first DC power supply signal may be provided to a first one of the pins 1153 and a second DC power supply signal may be provided to a second one of the pins 1153. The DC power supply signals have a similar magnitude but differ in polarity. For example, one of the DC power supply signal has a positive polarity and one of the DC power supply signals has a negative polarity. When the pins 1153 are mated with the terminals 212, the DC power supply signals provided to the chucking electrodes 270 generate an electrostatic chucking force that holds the substrate 186 against the surface of the electrostatic chuck 187. According, the electrostatic chuck 187 and the substrate 186 are transferred together by the transfer arm between processing regions 160 and the substrate 186 does not move relative to the electrostatic chuck 187. Further, one or more of the pins 1153 may be configured to mate with one or more terminals 214. In such an instance one or more of the pins 1153 is coupled to the power supply 1158 which provides AC power signals to one or more of the pins 1153. The AC power signals are coupled to the heating elements 272 via the pins 1153 and the terminals 214 to drive the heating elements 272 while the electrostatic chuck 187 and substrate 186 are supported by the transfer arm 1110 and transferred between processing regions 160. Accordingly, the electrostatic chuck 187 may control the temperature of the substrate 186 as the electrostatic chuck 187 and the substrate 186 are transferred between processing regions 160.

The lift actuator assembly 1168 is coupled to a pedestal shaft 1192, which is supported by bearings (not shown) that are coupled to the base 1119 to guide the pedestal shaft 1192 as it is translated by the lift actuator assembly 1168. A bellows assembly (not shown) is used to form a seal between the outer diameter of the pedestal shaft 1192 and a portion of the base 1119, such that a vacuum environment created within the transfer region 1101 by use of a pump 1154 is maintained during normal operation.

The pedestal assembly 1124 includes a substrate support 1126 that is coupled to the pedestal shaft 1192. The pedestal assembly 1124 includes a heater power source 1195, an electrostatic chuck power source 1196 and a backside gas source 1197. The substrate support 1126 supports the electrostatic chuck 187 and the substrate 186 within the processing region 160.

The substrate support 1126 comprises pins 1140 and 1142. The pins 1140 are coupled to the heater power source 1195. The pedestal assembly 1124 includes two or more pins 1140. Further, the pins 1140 are configured to mate (e.g., physically and electrically couple) with the terminals 214 of the electrostatic chuck 187. The heater power source 1195 provides an AC power signal or signals. The heater power source 1195 provides an AC power signal having a current in a range of about 20 A to about 30 A to the pins 1140 which is provided to the heating elements (e.g., heating elements 272 of FIG. 2) via the terminals 214 when the pins 1140 are mated with the terminals 214. In other embodiments, the heater power source 1195 provides an AC power signal having a current of less than 20 A or greater than 30 A.

The pins 1142 of the substrate support 1126 mate with the terminals 216 of the electrostatic chuck 187. The substrate support 1126 includes two or more pins 1142. In such embodiments, each of the pins 1142 is configured to couple to a different one of the terminals 216. For example, a first one of the pins 1142 is configured to couple to a first one of the terminals 216 and a second of the pins 1142 is configured to couple to a second one of the terminals 216. The pins 1142 are coupled to the electrostatic chuck power source 1196.

The electrostatic chuck power source 1196 provides DC power signals to the pins 1142. The pins 1142 couple the DC power signals to the terminals 216 and to the chucking electrodes 270 when the pins 1142 are mated with the terminals 216 to electrically chuck the substrate 186 to the electrostatic chuck 187. In one embodiment, the electrostatic chuck power source 1196 provides a positive DC power signal to a first one of the pins 1142 and a negative DC power signal to a second one of the pins 1142 to electrically chuck the substrate 186 to the electrostatic chuck 187. The DC power signals drive the pins 1142, the terminals 216, and the chucking electrodes 270 in a bi-polar configuration such that a first DC power signal is positive and a second DC power signal is negative. The magnitudes of the DC power signals may be the same. For example, the first DC power signal is about 1500 V and the second DC power signal is about −1500 V. Alternatively, the DC power signals have a magnitude greater than or less than about 1500 V. In other embodiments, the magnitude of a first one of the DC power signals differs from the magnitude of a second one of the DC power signals.

The pins 1140 and 1142 are removably coupled or non-removably (or permanently) coupled to the pedestal assembly 1124. For example, in one embodiment, the pins 1140 and/or 1142 are removably coupled and may be attached and removed from the pedestal assembly 1124 such that the pins 1140 and/or 1142 may be replaced without damaging the pedestal assembly 1124. The contact between the pins 1140 and 1142 and the terminals 214 and 216 causes wear to the pins 1140 and 1142. Over time, the pins 1140 and 1142 may need to be replaced. Removably coupling the pins 1140 and 1142 to the pedestal assembly 1124 allows the pins 1140 and 1142 to be removed and replaced when wear affects the operation of the pins 1140 and/or 1142 and degrades the coupling between the pins 1140, 1142 and the terminals 214, 216.

The pedestal assembly 1124 includes flexible element 1180. The flexible element 1180 includes a passageway 1182 and bellows 1184. The flexible element 1180 is configured to generate a seal against a bottom surface of the electrostatic chuck 187. A backside gas is provided via the backside gas source 1197 to the passageway 1182 of the flexible element 1180. The backside gas flows through the passageway 1182 into the space between the substrate 186 and the electrostatic chuck 187 to improve the uniformity of the thermal conductivity between the substrate 186 and the electrostatic chuck 187, improving the uniformity of the deposition of materials onto the substrate 186. The backside gas is nitrogen, helium, or argon, among others.

A process kit assembly 1130 generally includes a process region shield 1132 and a sealing assembly 1135. A station wall 1134 includes a first port that is coupled to a vacuum pump 1165 and is configured to evacuate the processing volume 1160 through a circumferential gap formed between an upper portion of the process region shield 1132, lower surface of the target 1172, and portion of the isolation ring 1133 and station wall 1134 during processing. The station wall 1134 is coupled to a gas source assembly 1189, and is configured to deliver one or more process gases (e.g., Ar, $N_2$) to the processing volume 1160 through a circumferential plenum during processing.

During processing of a substrate, e.g., FIG. 12, the substrate 186 and the electrostatic chuck 187 are positioned in a processing position below the source assembly 1170. When in the processing position the region 264 of the electrostatic chuck 187 forms a "seal" with a portion of the sealing assembly 1135 so as to substantially fluidly isolate the processing volume 1160 from the transfer region 1101. Thus, in the processing volume 1160, the electrostatic chuck 187, the sealing assembly 1135, the process region shield 1132, the station wall 1134, the isolation ring 1133 and target 1172 substantially enclose and define the processing volume 1160. The sealing assembly 1135 includes an upper plate 1135a, a bellows 1335b, and a lower plate 1135c. In some embodiments, the "seal" formed between the portion of the electrostatic chuck 187 and an upper plate 1135a of the sealing assembly 1135 is created at a sealing region that is formed by physical contact between a surface of the region 264 of the electrostatic chuck 187 and a surface of the upper plate 1135a. In some embodiments, a flexible bellows assembly 1135b of the sealing assembly 1135 is configured to be extended in the vertical direction as the portion of the electrostatic chuck 187 is placed in contact with the surface of the portion of the sealing assembly 1135 by use of the lift actuator assembly 1168 in the substrate support actuation assembly 1190. The compliant nature of the flexible bellows assembly allows any misalignment or planarity differences between the surface of the portion of the electrostatic chuck 187 and the surface of the portion of the sealing assembly 1135 to be taken up so that a reliable and repeatable seal can be formed at the region 264. The flexible bellows assembly 1135b may be a stainless steel bellows assembly or Inconel bellows assembly, among others. Further, a sealing force in a range of about 10 N to 400 N it utilized to mate one or more of the pins 1140 and/or 1142 with the terminals 214 and/or 216, respectively. Using the sealing force increases the amount of current that flows between the pins 1140 and/or 1142 and the terminals 214 and/or 216. The bellows 1135b may be configured to control the contact force between one or more of the pins 1140 and/or 1142 and one or more of the terminals 214 and/or 216. For example, by increasing or decreasing spring action expansion of the bellows 1135b, the contact force between respective pairs of the pins 1140, 1142 and the terminals 214 and 216 may be increased or decreased. Further, the force applied by the pedestal lift assembly 1191 onto the bellows 1135b may be increased or decreased to increase or decrease the contact force between pairs of the pins 1140, 1142 and the terminals 214 and 216. The force applied by the pedestal lift assembly 1191 may lift the upper plate 1135a of the sealing assembly 1135 by about 0.1 inches to about 0.4 inches, expanding the bellows 1135b. In other embodiments, the pedestal lift assembly 1191 may lift the upper plate 1335a by less than 0.1 inches or greater than 0.4 inches to expand the bellows 1135b. The amount at which the bellows 1135b is expanded results in a corresponding contact force between the pins 1140, 1142 and the terminals 214, 216.

Figure 13:
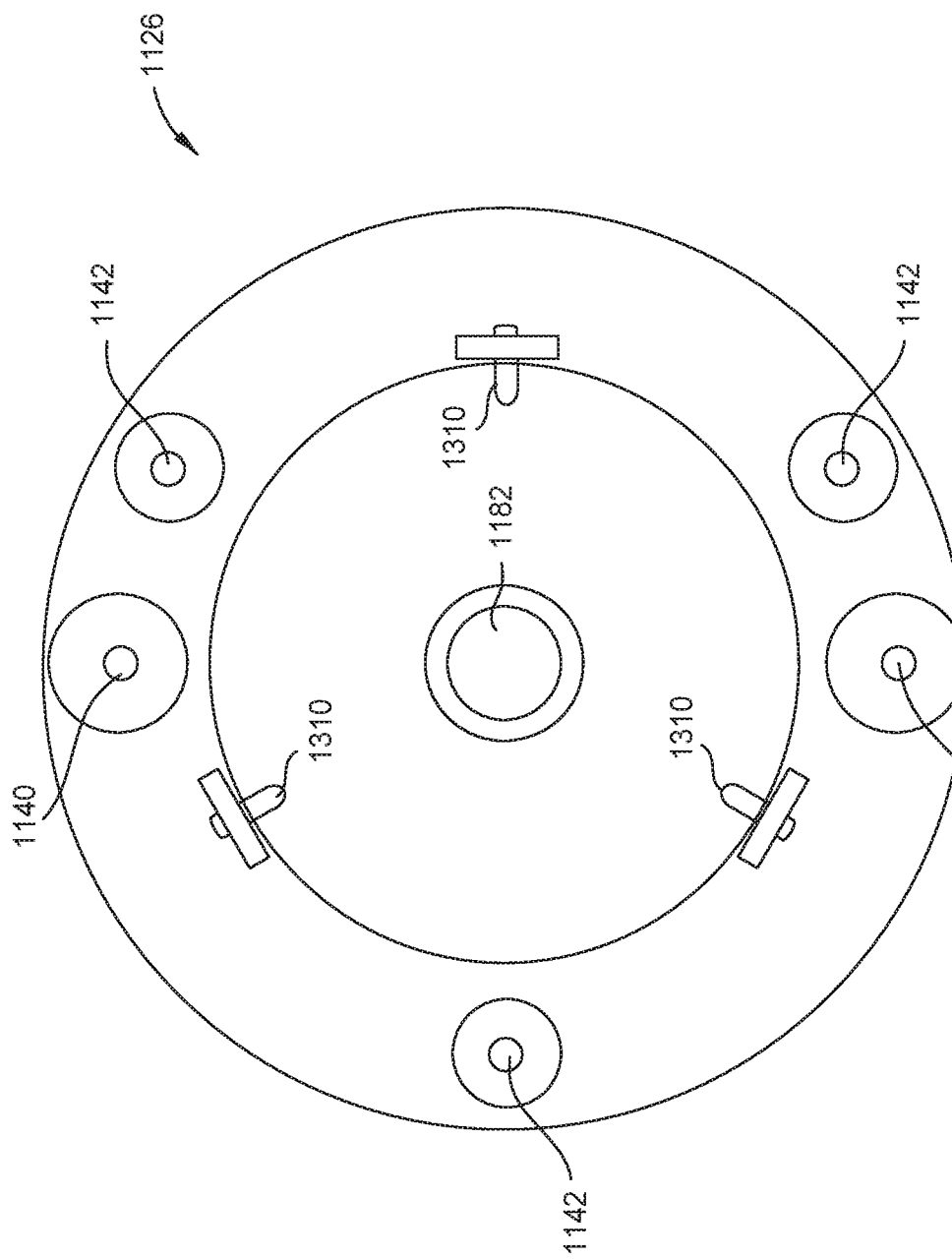
FIG. 13 is a plan view of a substrate support, according to one or more embodiments.
Figure 14:
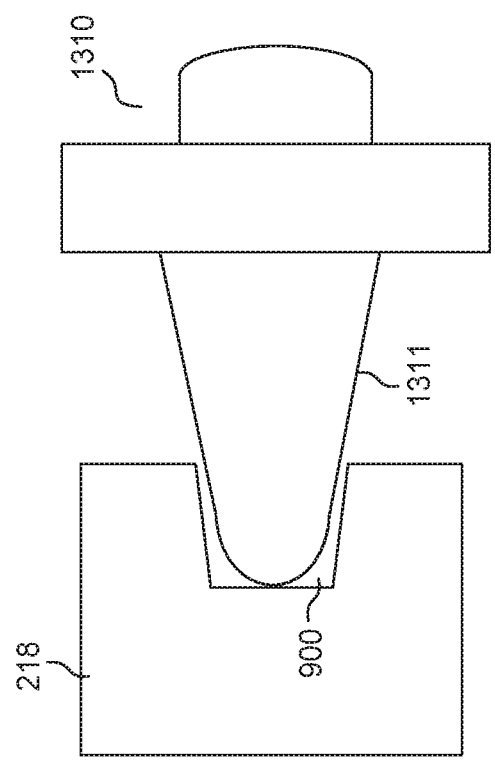
FIG. 14 is a plan view of a centering element and an alignment element, according to one or more embodiments.

FIG. 13 is a top view of the substrate support 1126 of the pedestal assembly 1124, according to one or more embodiments. As illustrated, the substrate support 1126 includes alignment elements 1310. The alignment elements 1310 are configured to interact with the centering elements 218 of the electrostatic chuck 187. The alignment elements 1310 aid in centering the electrostatic chuck 187 on the substrate support 1126. For example, as illustrated in FIG. 14, an extended region (e.g., the knob) 1311 of the alignment element 1310 fits within the slot 900 of the centering element 218. Fitting the extended region 1311 of each alignment element 1310 within the slot 900 of each centering element 218 centers the electrostatic chuck 187 over the substrate support 1126.

In one embodiment, the substrate support 1126 includes three or more alignment elements 1310. In other embodiments, the substrate support 1126 includes two or more alignment elements 1310.

While the foregoing is directed to embodiments of the present disclosure, other and further embodiments of the disclosure may be devised without departing from the basic scope thereof, and the scope thereof is determined by the claims that follow.

What is claimed is:
1. An electrostatic chuck comprising:
a chuck body having a top surface configured to support a substrate and a bottom surface opposite the top surface, wherein the chuck body comprises:
one or more chucking electrodes; and
one or more heating elements;
first terminals disposed on the bottom surface of the chuck body and coupled with the one or more heating elements;
second terminals disposed on the bottom surface of the chuck body and coupled with the one or more chucking electrodes;
third terminals disposed on the bottom first surface of the chuck body and coupled with the one or more chucking electrodes; and
a first center element disposed on the bottom surface of the chuck body and configured to interact with a first alignment element of a substrate support.
2. The electrostatic chuck of claim 1 further comprising a second centering element disposed on the bottom surface of the chuck body.
3. The electrostatic chuck of claim 1, wherein the chuck body further comprises a passageway configured to flow a backside gas between the top surface of the chuck body and the substrate.
4. The electrostatic chuck of claim 1, wherein a mating surface of the first terminals, the second terminals, and the third terminals is flat.
5. The electrostatic chuck of claim 1, wherein a mating surface of the first terminals, the second terminals, and the third terminals is one of convex, concave, or grooved.
6. The electrostatic chuck of claim 1, wherein the first terminals, the second terminals, and the third terminals are formed from one of molydbenum (Mo) and tungsten (W).
7. The electrostatic chuck of claim 1, wherein a number of third terminals is greater than a number of the second terminals, and wherein the third terminals are disposed closer to an outer edge of the electrostatic chuck than the second terminals.

8. The electrostatic chuck of claim 1, wherein the first terminals are configured to interact with first pins of the substrate support of a processing chamber, and the first pins are coupled to a first power source configured to output alternating current (AC) power supply signals.

9. The electrostatic chuck of claim 8, wherein the second terminals are configured to interact with second pins of the substrate support, and the second pins are coupled to a second power supply configured to output direct current (DC) power supply signals.

10. The electrostatic chuck of claim 9, wherein a first one of the second terminals is coupled to a first chucking electrode of the one or more chucking electrodes, and a second one of the second terminals is coupled to a second chucking electrode of the one or more chucking electrodes.

11. The electrostatic chuck of claim 10, wherein the third terminals are configured to interact with pins of a transfer arm, and the pins of the transfer arm are coupled to a third power source configured to output DC power supply signals.

12. The electrostatic chuck of claim 11, wherein a first one of the third terminals is coupled to the first chucking electrode, and a second one of the third terminals is coupled to the second chucking electrode.

13. The electrostatic chuck of claim 1, wherein the chuck body includes multiple, stepped regions between the top surface and the bottom surface.

14. The electrostatic chuck of claim 1, wherein a roughness of one or more the first terminals, the second terminals, and the third terminals is in a range of about 2 Ra to about 9 Ra.

15. A processing region comprising:
a pedestal assembly configured to move between a loading position and a processing position, the pedestal assembly comprising a substrate support comprising first pins coupled to a first power supply and second pins coupled to a second power supply; and
an electrostatic chuck comprising:
a chuck body having a top surface configured to support a substrate and a bottom surface opposite the top surface and configured to be supported by the substrate support, wherein the chuck body comprises:
one or more chucking electrodes; and
one or more heating elements;
first terminals disposed on the bottom surface of the chuck body and coupled with the one or more heating elements, the first terminals are configured mate with the first pins of the substrate support;
second terminals disposed on the bottom surface of the chuck body and coupled with the one or more chucking electrodes, the second terminals are configured to mate with the second pins of the substrate support;
third terminals disposed on the bottom first surface of the chuck body and coupled with the one or more chucking electrodes; and
a first center element disposed on the bottom surface of the chuck body and configured to interact with a first alignment element of the substrate support.

16. The processing region of claim 15, wherein the electrostatic chuck further comprises a second centering element disposed on the bottom surface of the chuck body, and the chuck body further comprises passageway configured to flow a backside gas between the top surface of the chuck body and the substrate.

17. The processing region of claim 15, wherein a mating surface of the first terminals, the second terminals, and the third terminals is one of flat, convex, concave, or grooved.

18. A cluster tool assembly comprising:
a processing region comprising:
a pedestal assembly configured to move between a loading position and a processing position, the pedestal assembly comprising a substrate support comprising first pins coupled to a first power supply and second pins coupled to a second power supply; and
an electrostatic chuck comprising:
a chuck body having a top surface configured to support a substrate and a bottom surface opposite the top surface and configured to be supported by the substrate support, wherein the chuck body comprises:
one or more chucking electrodes; and
one or more heating elements;
first terminals disposed on the bottom surface of the chuck body and coupled with the one or more heating elements, the first terminals are configured mate with the first pins of the substrate support;
second terminals disposed on the bottom surface of the chuck body and coupled with the one or more chucking electrodes, the second terminals are configured to mate with the second pins of the substrate support;
third terminals disposed on the bottom first surface of the chuck body and coupled with the one or more chucking electrodes; and
a first center element disposed on the bottom surface of the chuck body and configured to interact with a first alignment element of the substrate support.

19. The cluster tool assembly of claim 18, wherein the electrostatic chuck further comprises a second centering element disposed on the bottom surface of the chuck body, and the chuck body further comprises passageway configured to flow a backside gas between the top surface of the chuck body and the substrate.

20. The cluster tool assembly of claim 18, wherein a mating surface of the first terminals, the second terminals, and the third terminals is one of flat, convex, concave, or grooved.

* * * * *